US006396128B1

(12) United States Patent
Inata (10) Patent No.: US 6,396,128 B1
(45) Date of Patent: May 28, 2002

(54) FIXING STRUCTURE AND FIXING METHOD FOR SEMICONDUCTOR INTEGRATED CIRCUIT APPARATUS

(75) Inventor: Makoto Inata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/672,792

(22) Filed: Sep. 29, 2000

(30) Foreign Application Priority Data

Apr. 17, 2000 (JP) ........................................ 2000-115574

(51) Int. Cl.$^7$ ......................... H01L 23/495; H01L 21/00
(52) U.S. Cl. ........................ 257/666; 257/667; 257/668; 257/673; 257/676; 228/180.21; 228/180.22; 29/25.01; 269/21
(58) Field of Search ................................. 257/666, 667, 257/668, 669, 670, 671, 672, 673, 674, 675, 676, 677, 678, 679, 680; 228/180, 180.21, 180.22; 29/25.01; 269/21

(56) References Cited

U.S. PATENT DOCUMENTS

| 4,733,462 A | * | 3/1988 | Kawatani ...................... 29/840 |
| 5,240,170 A | * | 8/1993 | Nishida et al. ......... 228/180.21 |
| 5,271,549 A | * | 12/1993 | Tohyama ............... 228/180.21 |
| 5,619,145 A | * | 4/1997 | Matsuda ...................... 324/754 |
| 5,928,537 A | * | 7/1999 | Fortune ....................... 219/230 |

FOREIGN PATENT DOCUMENTS

| JP | 2-5381 | 1/1990 |
| JP | 8-172147 | 7/1996 |
| JP | 09162525 A | * 6/1997 |

* cited by examiner

*Primary Examiner*—Eddie Lee
*Assistant Examiner*—Chris Chu
(74) *Attorney, Agent, or Firm*—Burns, Doane, Swecker & Mathis, LLP

(57) ABSTRACT

After a semiconductor integrated circuit apparatus is put on a print wiring board so as to place each pad of the semiconductor integrated circuit apparatus on the corresponding lead terminal of the print wiring board and to place the semiconductor integrated circuit apparatus on a through hole of the print wiring board, a fixing portion of a suction and drawing unit is pressed into the through hole, and a suction portion of the suction and drawing unit makes contact with the lower surface of the semiconductor integrated circuit apparatus. Thereafter, when the pressure of gas existing in the inside of the suction and drawing unit is reduced, the suction portion suctions the semiconductor integrated circuit apparatus and draws the semiconductor integrated circuit apparatus toward the print wiring board to press each pad of the semiconductor integrated circuit apparatus on the corresponding lead terminal of the print wiring board. Therefore, the semiconductor integrated circuit apparatus can be reliably and easily fixed on the print wiring board while being electrically connected with the print wiring board. Accordingly, because no electrical contact portion is used, a response time in the operation of the semiconductor integrated circuit apparatus is not delayed. Also, because no soldering operation is performed, the semiconductor integrated circuit apparatus can be quickly fixed on the print wiring board at a low cost.

14 Claims, 3 Drawing Sheets

PRESSURE REDUCTION

FIXING STRUCTURE AND FIXING METHOD FOR SEMICONDUCTOR INTEGRATED CIRCUIT APPARATUS

BACKGROUND OF THE INVENTION

1. Field of the Invention

The present invention relates to a fixing structure and a fixing method for fixing a semiconductor integrated circuit apparatus on a print wiring board while electrically connecting lead terminals of the semiconductor integrated circuit apparatus with pads of the print wiring board.

2. Description of Related Art

In a conventional method for mounting a semiconductor integrated circuit apparatus on a print wiring board, a socket having a plurality of electrical contact portions is prepared for a semiconductor integrated circuit apparatus, and each of a plurality of external connecting terminals of the semiconductor integrated circuit apparatus is connected with the corresponding electrical contact portion of the socket. Thereafter, the semiconductor integrated circuit apparatus is mounted on a print wiring board through the socket while being electrically connected with the print wiring board.

A conventional fixing structure for fixing the semiconductor integrated circuit apparatus on the print wiring board by using a conventional fixing method is described.

A cap is put on the semiconductor integrated circuit apparatus, which is mounted on the print wiring board, from the same direction as a mounting direction of the semiconductor integrated circuit apparatus, and four corners of the cap are screwed down so as to press the external connecting terminals of the semiconductor integrated circuit apparatus on the electrical contact portions of the socket. Therefore, the external connecting terminals of the semiconductor integrated circuit apparatus are tightly connected with the electrical contact portions of the socket, and the semiconductor integrated circuit apparatus is fixed on the print wiring board.

Also, in another conventional fixing structure using a conventional fixing method, after each external connecting terminal of the semiconductor integrated circuit apparatus is connected with the corresponding electrical contact portion of the socket, a cap is put on the semiconductor integrated circuit apparatus, and the cap and the semiconductor integrated circuit apparatus are pushed down toward the print wiring board in the same direction as a mounting direction of the semiconductor integrated circuit apparatus, while moving the cap by using a lever operated according to a cam mechanism, so as to press each external connecting terminal of the semiconductor integrated circuit apparatus on the corresponding electrical contact portion of the socket. Therefore, the external connecting terminals of the semiconductor integrated circuit apparatus are tightly connected with the electrical contact portions of the socket, and the semiconductor integrated circuit apparatus is fixed on the print wiring board.

However, because each external connecting terminal of the semiconductor integrated circuit apparatus is fixed on the print wiring board by using the conventional fixing structure for the semiconductor integrated circuit apparatus, the electrical contact portion of the socket is located between the external connecting terminal of the semiconductor integrated circuit apparatus and a wiring portion of the print wiring board. Therefore, a response time in the operation performed in the semiconductor integrated circuit apparatus is delayed by a contact capacitance of the electrical contact portion, and there is a problem that the performance of the semiconductor integrated circuit apparatus is adversely affected.

Also, in cases where the semiconductor integrated circuit apparatus is repeatedly used, the electrical contact portion of the socket may be deformed, or the cap may not be correctly fixed at a prescribed position. In this case, there is a problem that the external connecting terminal of the semiconductor integrated circuit apparatus is not connected with the electrical contact portion of the socket.

Also, the socket is soldered to the print wiring board to arrange the socket on the print wiring board. Therefore, in cases where the electrical contact portion of the socket is deformed, there is a problem that it is difficult to replace the socket with a new socket when the electrical contact portion of the socket is deformed.

Also, because the number of socket terminals respectively soldered to the print wiring board corresponds to the number of external connecting terminals of the semiconductor integrated circuit apparatus, it is required to perform the soldering of the socket terminal to the print wiring board many times. Therefore, there is a problem that it takes a lot of time to connect the socket with the print wiring board.

Also, because the number of external connecting terminals of a semiconductor integrated circuit apparatus and the shape of the external connecting terminals depend on a type of the semiconductor integrated circuit apparatus, various types of sockets respectively matching with one type of semiconductor integrated circuit apparatus are required. Therefore, there is a problem that the fixing structure cannot be prepared at a low cost.

SUMMARY OF THE INVENTION

An object of the present invention is to provide, with due consideration to the drawbacks of the conventional fixing structure and the conventional fixing method for the semiconductor integrated circuit apparatus, a fixing structure and a fixing method for a semiconductor integrated circuit apparatus in which the semiconductor integrated circuit apparatus is easily and reliably fixed on a print wiring board at a low cost, without delaying a response time in the operation of the semiconductor integrated circuit apparatus, while electrically connecting the semiconductor integrated circuit apparatus with the print wiring board.

The object is achieved by the provision of a fixing structure for a semiconductor integrated circuit apparatus, in which a semiconductor integrated circuit apparatus is fixed on a print wiring board, comprising:

a hole portion arranged in the print wiring board; and suction and fixing means for suctioning the semiconductor integrated circuit apparatus through the hole portion to press an external connecting terminal of the semiconductor integrated circuit apparatus on a wiring portion of the print wiring board and fixing the semiconductor integrated circuit apparatus on the print wiring board.

Also, the object is achieved by the provision of a fixing method for a semiconductor integrated circuit apparatus, comprising the steps of:

preparing a hole portion arranged in a print wiring board;

suctioning a semiconductor integrated circuit apparatus through the hole portion so as to press an external connecting terminal of the semiconductor integrated circuit apparatus on a wiring portion of the print wiring board; and fixing the semiconductor integrated circuit apparatus on the print wiring board.

In the above configuration and steps, because the suction and fixing means suctions the semiconductor integrated circuit apparatus through the hole portion, the semiconductor integrated circuit apparatus is drawn toward the print wiring board. Therefore, the external connecting terminal of the semiconductor integrated circuit apparatus is pressed on the wiring portion of the print wiring board by suction.

Accordingly, the semiconductor integrated circuit apparatus can be easily and reliably fixed on the print wiring board at a low cost regardless of a type of the semiconductor integrated circuit apparatus.

Also, because no electrical contact portion exists between the external connecting terminal of the semiconductor integrated circuit apparatus and the wiring portion of the print wiring board, there is no probability that a response time in the operation of the semiconductor integrated circuit apparatus is delayed by a contact capacitance of an electrical contact portion.

Also, because no electrical contact portion is used in the fixing structure, the fixing structure can be simplified. Therefore, the fixing structure can be easily manufactured. Also, even though the semiconductor integrated circuit apparatus is fixed on the print wiring board many times, there is no probability that the semiconductor integrated circuit apparatus receives mechanical damage.

Also, because the external connecting terminal of the semiconductor integrated circuit apparatus is pressed on the wiring portion of the print wiring board by suction, the semiconductor integrated circuit apparatus can be electrically connected with the print wiring board without a soldering operation. Therefore, a time required to fix the semiconductor integrated circuit apparatus on the print wiring board can be reduced.

Also, the fixing structure is useful regardless of whether a surface mounting type semiconductor integrated circuit apparatus has a plurality of external connecting terminals on both sides or on all four sides. Also, the fixing structure is useful regardless of the number of external connecting terminals, the pitch of the external connecting terminals or a size of a package in which the external connecting terminals is accommodated. Therefore, the fixing structure can be widely used.

Also, no cap covering the semiconductor integrated circuit apparatus is used to fix the semiconductor integrated circuit apparatus on the print wiring board, an exposed area of the semiconductor integrated circuit apparatus is sufficient to radiate heat from the semiconductor integrated circuit apparatus. Therefore, the heat radiation of the semiconductor integrated circuit apparatus can be improved, and the performance of the semiconductor integrated circuit apparatus can be reliably maintained even though a degree of heat generated in the semiconductor integrated circuit apparatus is high.

It is preferred that the suction and fixing means comprises a suction portion for suctioning the semiconductor integrated circuit apparatus through the hole portion; a fixing portion for making contact with the print wiring board in the suctioning of the suction portion; and a pressure reducing tube portion, connected with an external pressure reducing unit, for setting the suction portion to a pressure reduced state.

In the above configuration, because the suction portion is set to a pressure reduced state by reducing an internal, pressure of the suction portion by the operation of the external pressure reducing unit, the suction portion can suction the semiconductor integrated circuit apparatus. Also, because the fixing portion makes contact with the print wiring board, the suction and fixing means can be positioned into the hole portion arranged in the print wiring board.

It is preferred that the suction portion, the fixing portion and the pressure reducing tube portion are integrally formed with each other.

Therefore, the mass production of the suction and fixing means can be improved.

It is preferred that the suction and fixing means comprises a plurality of suction portions for respectively suctioning the semiconductor integrated circuit apparatus through the hole portion; a fixing portion for making contact with the print wiring board in the suctioning of the suction portions; and a pressure reducing tube portion, connected with an external pressure reducing unit, for setting each of the suction portions to a pressure reduced state.

In the above configuration, because the plurality of suction portions respectively suction the semiconductor integrated circuit apparatus, even though the size of the semiconductor integrated circuit apparatus is sufficiently large as compared with a total area of the suction portions, the semiconductor integrated circuit apparatus can be uniformly drawn toward the print wiring board by the suction portions without inclining the semiconductor integrated circuit apparatus with respect to the print wiring board. Therefore, the semiconductor integrated circuit apparatus can be stably fixed on the print wiring board while precisely positioning the external connecting terminal of the semiconductor integrated circuit apparatus on the pad of the print wiring board.

It is preferred that the fixing portion of the suction and fixing means is pressed into the hole portion of the print wiring board to fix the suction and fixing means to the print wiring board.

Because the suction and fixing means is fixed to the print wiring board by pressing the fixing portion into the hole portion, the configuration of the suction and fixing means can be simplified, and the semiconductor integrated circuit apparatus can be fixed on the print wiring board without the semiconductor integrated circuit apparatus being out of position.

It is preferred that the fixing portion of the suction and fixing means is soldered to a reverse surface of the print wiring board to fix the suction and fixing means to the print wiring board.

Therefore, the suction and fixing means can be reliably fixed to the print wiring board, and the semiconductor integrated circuit apparatus can be fixed on the-print wiring board without the semiconductor integrated circuit apparatus being out of position.

It is preferred that the suction and fixing means adjusts a degree of pressure of the external connecting terminal of the semiconductor integrated circuit apparatus, which is applied on the wiring portion of the print wiring board, according to the pressure reduced state of the suction portion.

Therefore, there is no probability that the external connecting terminal of the semiconductor integrated circuit apparatus is excessively pressed on the wiring portion of the print wiring board, and the external connecting terminal of the semiconductor integrated circuit apparatus can be prevented from being mechanically damaged.

It is preferred that the suction and fixing means adjusts a degree of pressure of the external connecting terminal of the semiconductor integrated circuit apparatus, which is applied on the wiring portion of the print wiring board, by moving the suction and fixing means in a suction direction.

Therefore, the electrical connection between the external connecting terminal of the semiconductor integrated circuit apparatus and the wiring portion of the print wiring board can be reliably obtained.

It is preferred that the fixing structure further comprises a positioning guide, arranged on the print wiring board, for positioning the semiconductor integrated circuit apparatus.

In the above configuration, the operation for positioning the semiconductor integrated circuit apparatus on the print wiring board can be simplified, and the fixing of the semiconductor integrated circuit apparatus on the print wiring board can be easily performed.

It is preferred that the wiring portion is placed in a 'concave area of the print wiring board, and the external connecting terminal of the semiconductor integrated circuit apparatus is pressed on the wiring portion placed in the concave area of the print wiring board.

Therefore, the external connecting terminal of the semiconductor integrated circuit apparatus can be easily put on the wiring portion of the print wiring board, and the external connecting terminal of the semiconductor integrated circuit apparatus-can be-reliably pressed on the wiring portion of the print wiring board without the external connecting terminal being out of position.

It is preferred that the wiring portion is placed in a convex area of the print wiring board, and the external connecting terminal of the semiconductor integrated circuit apparatus is pressed on the wiring portion placed in the convex area of the print wiring board.

Therefore, because the wiring portion is placed in the convex area of the print wiring board, an operator can easily ascertain the position of the wiring portion in three dimensions, and the external connecting terminal of the semiconductor integrated circuit apparatus can be easily put on the wiring portion of the print wiring board. Also, because the convex area of the print wiring board can be easily deformed, a degree of pressure of the external connecting terminal of the semiconductor integrated circuit apparatus, which is applied on the wiring portion of the print wiring board, can be heightened, and the electrical connection between the external connecting terminal of the semiconductor integrated circuit apparatus and the wiring portion of the print wiring board can be reliably obtained.

It is preferred that the fixing structure further comprises a guide layer which has a concave area and is arranged on the print wiring board, and the wiring portion of the print wiring board is placed in the concave area of the guide layer.

In the above configuration, the setting position of the external connecting terminal of the semiconductor integrated circuit apparatus can be easily determined, and the external connecting terminal of the semiconductor integrated circuit apparatus can be reliably pressed on the wiring portion of the print wiring board without the external connecting terminal being out of position.

It is preferred that the suction and fixing means is formed of elastic material.

Because the suction and fixing means is deformed to reduce a size of the suction and fixing means, a force of restitution is generated in the suction and fixing means, and the external connecting terminal of the semiconductor integrated circuit apparatus is strongly pressed on the wiring portion of the print wiring board.

DETAILED DESCRIPTION OF THE PREFERRED EMBODIMENTS

The invention will now be described with reference to the accompanying drawings.

Embodiment 1

Figure 1:
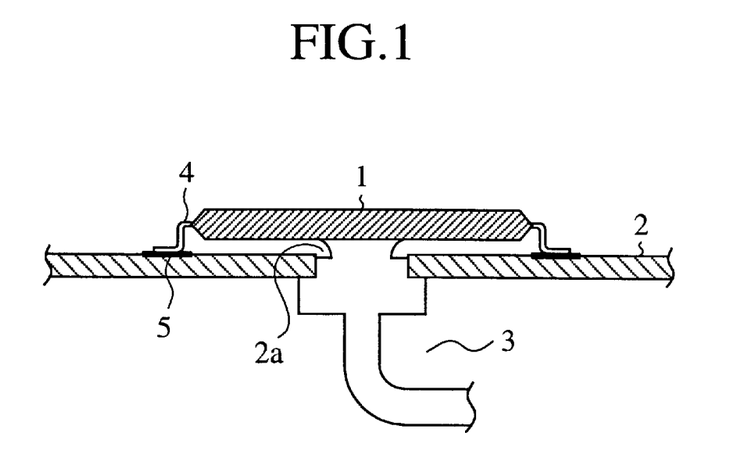
FIG. 1 is a cross sectional view of a fixing structure device for a semiconductor integrated circuit apparatus according to a first embodiment of the present invention.

FIG. 1 is a cross sectional view of a fixing structure device for a semiconductor integrated circuit apparatus according to a first embodiment of the present invention. In FIG. 1, 1 indicates a semiconductor integrated circuit apparatus representing a semiconductor integrated circuit (IC), 2 indicates a print wiring board on which the semiconductor integrated circuit apparatus 1 is arranged, 2a indicates a through hole (or a hole portion) of the print wiring board 2, 3 indicates a suction and drawing unit (or a suction and fixing means). The suction and drawing unit 3 passes through the through hole 2a of the print wiring board 2, suctions the lower surface of the semiconductor integrated circuit apparatus 1 by reducing the pressure of atmospheric gas existing into the suction and drawing unit 3 and draws the semiconductor integrated circuit apparatus 1 toward the print wiring board 2 by suction. 5 indicates each of a plurality of pads (or wiring portions) of the print wiring board 2, and 4 indicates each of a plurality of lead terminals (or external connecting terminals) of the semiconductor integrated circuit apparatus 1. Each pad 5 of the print wiring board 2 denotes a wiring portion of the print wiring board 2, and each lead terminal 4 of the semiconductor integrated circuit apparatus 1 is pressed on and tightly connected with the corresponding pad 5 of the print wiring board 2 in cases where the semiconductor integrated circuit apparatus 1 is drawn toward the print wiring board 2 by suction in a suction operation of the suction and drawing unit 3. A fixing structure device for the semiconductor integrated circuit apparatus 1 comprises the through hole 2a and the suction and drawing unit 3.

Figure 2:
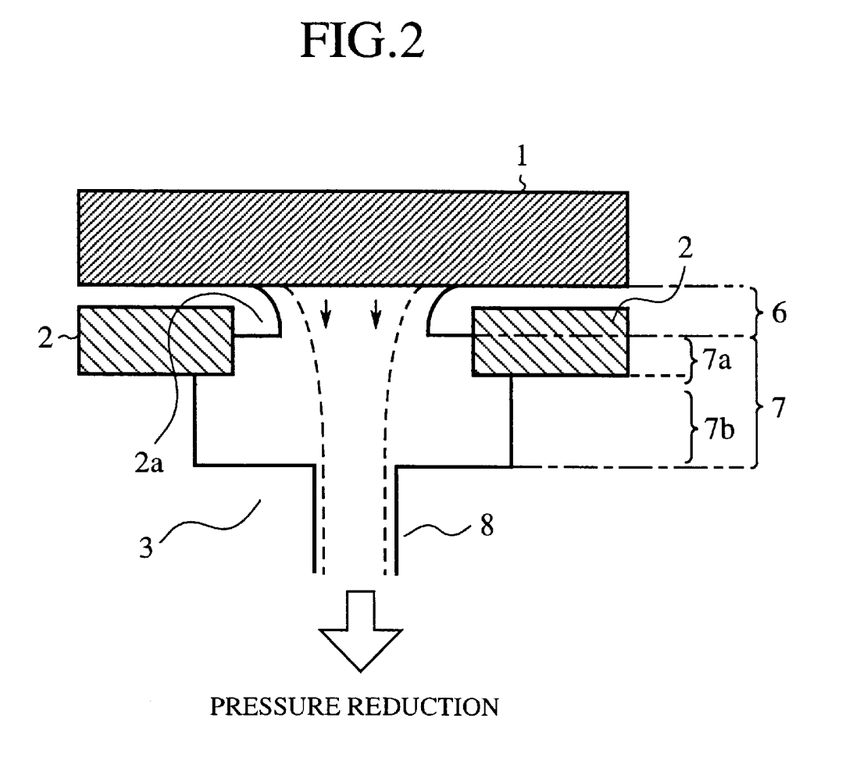
FIG. 2 is an enlarged view of a suction and drawing unit shown in FIG. 1 and its peripheral area.

FIG. 2 is an enlarged view of the suction and drawing unit 3 and its peripheral area. In FIG. 2, 6 indicates a suction portion of the suction and drawing unit 3. The suction portion 6 directly makes contact with the semiconductor integrated circuit apparatus 1 to draw the semiconductor integrated circuit apparatus 1 by suction. 7 indicates a fixing portion of the suction and drawing unit 3. The fixing portion 7 directly makes contact with the print wiring board 2 to fix a positional relationship between the suction and drawing unit 3 and the print wiring board 2. 7a indicates an upper fixing portion of the fixing portion 7. The upper fixing portion 7a has almost the same diameter as that of the through hole 2a so as to be pressed into the through hole 2a and to position the suction and drawing unit 3. 7b indicates a lower fixing portion of the fixing portion 7. The lower fixing portion 7b has a diameter larger than that of the through hole 2a and makes contact with a peripheral portion of the through hole 2a on a reverse side of the print wiring board 2 to fix the suction and drawing unit 3 when the semiconductor integrated circuit apparatus 1 is drawn by suction. 8 indicates a pressure reducing tube portion of the fixing portion 7. The pressure reducing tube portion 8 is connected with an external vacuum device (or a pressure reducing device) (not shown) to set the suction portion 6 to a pressure reduced state. The same constituent elements as those shown in FIG. 1 are indicated by the same reference numerals as those attached to the constituent elements shown in FIG. 1 and the description of the constituent elements is omitted.

Next, an operation of the fixing structure device for the semiconductor integrated circuit apparatus 1 is described.

The semiconductor integrated circuit apparatus 1 is put on the print wiring board 2 so as to place each lead terminal 4 of the semiconductor integrated circuit apparatus 1 on the corresponding pad 5 of the print wiring board 2 and to place the semiconductor integrated circuit apparatus 1 above the through hole 2a of the print wiring board 2. Thereafter, the suction and drawing unit 3 attaching to the lower surface of the semiconductor integrated circuit apparatus 1 through the through hole 2a draws the semiconductor integrated circuit apparatus 1 toward the print wiring board 2 in a suction operation of the suction and drawing unit 3.

The suction operation of the suction and drawing unit 3 is described in detail. The upper fixing portion 7a, of which the diameter is almost the same as that of the through hole 2a, is pressed into the through hole 2a to make contact with the inner surface of the through hole 2a. Therefore, the suction and drawing unit 3 is fixed and positioned in the through hole 2a. Also, the lower fixing portion 7b of the suction and drawing unit 3 makes contact with a peripheral portion of the through hole 2a on the reverse side of the print wiring board 2. Therefore, the print wiring board 2 is placed between the semiconductor integrated circuit apparatus 1 and the suction and drawing unit 3, and the suction portion 6 of the suction and drawing unit 3 makes contact with the lower surface of the semiconductor integrated circuit apparatus 1. Thereafter, the inside space of the suction and drawing unit 3 is vacuumed by operating an external vacuum device (or a pressure reducing device) (not shown) connected with the pressure reducing tube portion 8 of the suction and drawing unit 3. Therefore, the suction portion 6 of the suction and drawing unit 3 strongly suctions the lower surface of the semiconductor integrated circuit apparatus 1, and the semiconductor integrated circuit apparatus 1 receives a suction force from the suction and drawing unit 3 so as to make the suction and drawing unit 3 press the lead terminals 4 of the semiconductor integrated circuit apparatus 1 on the pads 5 of the print wiring board 2. As a result, each lead terminal 4 of the semiconductor integrated circuit apparatus 1 is tightly connected with the corresponding pad 5 of the print wiring board 2, and the semiconductor integrated circuit apparatus 1 is fixed on the print wiring board 2.

In cases where the suction and drawing unit 3 is, for example, made of elastic material such as rubber, the lower fixing portion 7b making contact with the peripheral portion of the through hole 2a is deformed in the suction operation to reduce the size of the lower fixing portion 7b. Therefore, a force of restitution generated in the lower fixing portion 7b is strongly applied to the peripheral portion of the through hole 2a, and the suction and drawing unit 3 is strongly fixed to the print wiring board 2. Also, the suction portion 6 of the suction and drawing unit 3 is deformed in the suction operation to reduce the size of the suction portion 6, a distance between the lower surface of the semiconductor integrated circuit apparatus 1 and the fixing portion 7 is shortened, and each lead terminal 4 of the semiconductor integrated circuit apparatus 1 is moreover tightly connected with the corresponding pad 5 of the print wiring board 2.

Next, the suction and drawing unit 3 is described in detail.

Figure 3:
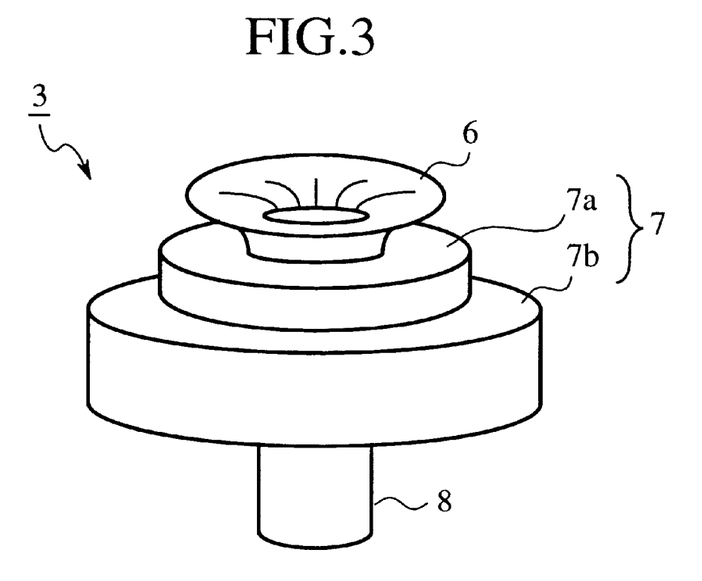
FIG. 3 is an oblique view of the suction and drawing unit composing the fixing structure device for the semiconductor integrated circuit apparatus shown in FIG. 1.

FIG. 3 is an oblique view of the suction and drawing unit 3 composing the fixing structure device for the semiconductor integrated circuit apparatus 1 shown in FIG. 1. In the suction and drawing unit 3 shown in FIG. 3, the suction portion 6 has a suction disk, and the fixing portion 7 is formed in a double-cylindrical shape. The diameter of a lower cylinder corresponding to the lower fixing portion 7b is larger than that of an upper cylinder corresponding to the upper fixing portion 7a. The suction portion 6 has a size smaller than that of the through hole 2a so as to pass through the through hole 2a (see FIG. 1) of the print wiring board 2, the fixing portion 7 has a shape so as to fix a positional relationship between the suction and drawing unit 3 and the print wiring board 2 (see FIG. 1) in the suction operation, and the suction and drawing unit 3 has a function for fixing the semiconductor integrated circuit apparatus 1 on the print wiring board 2.

Therefore, the suction portion 6 is not limited to a circular shape of the suction disk. For example, it is applicable that the suction portion 6 be formed in a cylindrical shape, a cylindroid shape, a rectangular shape or the like. Also, each of the upper fixing portion 7a and the lower fixing portion 7b is not limited to the cylindrical shape. For example, it is applicable that each of the upper fixing portion 7a and the lower fixing portion 7b be formed in a cylindroid shape, a rectangular shape or the like. In this case, the through hole 2a has an elliptical shape, a square shape or the like. Also, it is applicable that the shape of the upper fixing portion 7a differ from that of the lower fixing portion 7b. Also, the pressure reducing tube portion 8 is not limited to the cylindrical shape. For example, it is, applicable that the pressure reducing tube portion 8 be formed in a rectangular shape, a polygonal shape or a bellows shape like a flexible hose.

Also, it is applicable that the suction portion 6, the fixing portion 7 and the pressure reducing tube portion 8 be integrally formed with each other. In this case, the mass production of the suction and drawing unit 3 can be improved.

The suction and drawing unit 3 may be formed of rubber having elasticity, synthetic resin, plastic or the like. Such materials maintain a vacuum (or pressure reduced state) in the suction and drawing unit 3. Also, it is applicable that the fixing portion 7 be formed of ceramic or metal.

Also, in cases where the size of the semiconductor integrated circuit apparatus 1 to be fixed on the print wiring board 2 is near to the size of the suction disk of the suction portion 6, because a suctioned area of the semiconductor integrated circuit apparatus 1 is sufficient to suction the semiconductor integrated circuit apparatus 1, a vacuum pen or a syringe, of which a pressure reducing degree is low, is used as an external vacuum device (or a pressure reducing device). In contrast, in cases where the size of the semiconductor integrated circuit apparatus 1 is sufficiently larger than that of the suction disk of the suction portion 6, because a suctioned area of the semiconductor integrated circuit apparatus 1 is not sufficient to suction the semiconductor integrated circuit apparatus 1, a vacuum pump, obtaining a high degree of pressure reduction, is used as an external vacuum device (or a pressure reducing device).

Also, in cases where it is desired that each lead terminal 4 of the semiconductor integrated circuit apparatus 1 is tightly connected with the corresponding pad 5 of the print wiring board 2 by drawing the semiconductor integrated circuit apparatus 1 toward the print wiring board 2, it is applicable that the suction and drawing unit 3 be moved in a drawing direction (that is, a lower direction in FIG. 2) to adjust a degree of the connection between the lead terminal 4 and the pad 5. More precisely, a plurality of screws are arranged in advance to penetrate the lower fixing portion 7b from a peripheral area of the pressure reducing tube portion 8 to the reverse surface of the print wiring board 2 placed in the peripheral area of the through hole 2a. The screws are placed in equal intervals not to incline the suction and drawing unit 3. When the suction operation is performed, the screws are turned into the reverse surface of the print wiring board 2 to make the lower fixing portion 7b move far from the print wiring board 2 in the drawing direction. Therefore, the force for fixing the semiconductor integrated circuit apparatus 1 on the print wiring board 2 is strengthened, and the electrical connection between the lead terminals 4 of the semiconductor integrated circuit apparatus 1 and the pads 5 of the print wiring board 2 can be reliably obtained.

This embodiment is not limited to the arrangement of the screws. For example, it is applicable that one or more wedges be driven into a space between the print wiring board 2 and the suction and drawing unit 3.

Also, because there is a probability that each lead terminal 4 of the semiconductor integrated circuit apparatus 1 is excessively pressed on the corresponding pad 5 of the print wiring board 2 and deforms the lead terminal 4, it is applicable that the tightness of the connection between each lead terminal 4 and the corresponding pad 5 be adjusted according to the degree of the pressure reduced state of the suction portion 6 to prevent the lead terminal 4 from being deformed or mechanically damaged.

More precisely, in cases where a vacuum pen or a syringe, of which a pressure reducing degree is low, is used as an external vacuum device (or a pressure reducing device), the pressure reducing degree is changed by adjusting a cylinder of the vacuum pen or the syringe. In contrast, in cases where a vacuum pump, of which a pressure reducing degree is high, is used as an external vacuum device (or a pressure reducing device), a buffer vessel having a certain capacity is arranged between the vacuum pump and the pressure reducing tube portion 8, and the buffer vessel is connected with the vacuum pump through a for-vacuum valve such as a needle valve. Thereafter, an ultimate vacuum degree in the suction and drawing unit 3 and the buffer vessel is changed by adjusting an open degree of the needle valve while considering a pumping speed of the vacuum pump. Because the pressure reduced state of the suction portion 6 changes in dependence on the ultimate vacuum degree, a degree of the tight connection between each lead terminal 4 and the corresponding pad 5 can be adjusted. Therefore, when the suction portion 6 suctions the semiconductor integrated circuit apparatus 1, the lead terminal 4 of the semiconductor integrated circuit apparatus 1 can be prevented from being mechanically damaged.

The through hole 2a arranged in the print wiring board 2 is not limited to a circular shape. That is, any shape of the through hole 2a is available on condition that the suction portion 6 and the upper fixing portion 7a can pass through the through hole 2a and the lower fixing portion 7b can make contact with the peripheral area of the through hole 2a in the suction operation.

Also, it is applicable that the suction and drawing unit 3 be soldered and fixed to the reverse surface of the print wiring board 2 not to come off the print wiring board 2.

Also, the lower fixing portion 7b is not necessarily required. That is, it is applicable that the diameter of the fixing portion 7 is slightly larger than that of the through hole 2a. In this case, the fixing portion 7 is pushed into the through hole 2a, and the fixing portion 7 is fixed in the through hole 2a because of a frictional force between the inner wall of the through hole 2a and the outer wall of the fixing portion 7. Therefore, the configuration of the suction and drawing unit 3 can be simplified, and the semiconductor integrated circuit apparatus 1 can be fixed on the print wiring board 2 while precisely positioning the lead terminals 4 of the semiconductor integrated circuit apparatus 1 on the pads of the print wiring board 2.

Accordingly, in the first embodiment, the print wiring board 2 has the through hole 2a to place the semiconductor integrated circuit apparatus 1 above the through hole 2a, and the suction and drawing unit 3 suctions the semiconductor integrated circuit apparatus 1 through the through hole 2a to press the lead terminals 4 of the semiconductor integrated circuit apparatus 1 on the pads 5 of the print wiring board 2 and to fix the semiconductor integrated circuit apparatus 1 on the print wiring board 2. Therefore, because no electrical contact portion is arranged between each lead terminal 4 of the semiconductor integrated circuit apparatus 1 and the corresponding pad 5 of the print wiring board 2, the response delay of the semiconductor integrated circuit apparatus 1 caused by the contact capacitance of an electrical contact portion can be prevented. Also, because no electrical contact portion is required in the fixing structure device for the semiconductor integrated circuit apparatus 1, the configuration of the fixing structure device can be simplified, the fixing structure device can be easily manufactured at a low cost. Also, even though the semiconductor integrated circuit apparatus 1 is fixed on the print wiring board 2 many times, the mechanical damage of the lead terminals 4 of the semiconductor integrated circuit apparatus 1 can be prevented.

Also, because the suction and drawing unit 3 presses the lead terminals 4 of the semiconductor integrated circuit apparatus 1 on the pads 5 of the print wiring board 2 in the suction operation to electrically connect the semiconductor integrated circuit apparatus 1 with the print wiring board 2, no soldering operation is required. Therefore, the working for fixing the semiconductor integrated circuit apparatus-1 on the print wiring board 2 can be easily and reliably performed at a low cost, and a time required for the fixing working can be shortened.

Also, a surface mounting type semiconductor integrated circuit formed in a rectangular package shape generally has a plurality of lead terminals on both sides or on four sides. In this embodiment, because the semiconductor integrated circuit apparatus 1 is fixed on the print wiring board 2 by suctioning the semiconductor integrated circuit apparatus 1, the fixing structure device is useful for the semiconductor integrated circuit apparatus 1 regardless of whether the semiconductor integrated circuit apparatus 1 has the lead terminals 4 on both sides or on four sides. Also, the fixing structure device is useful regardless of the number of lead terminals 4 of the semiconductor integrated circuit apparatus 1, the pitch of the lead terminals 4 or a size of a package in which the semiconductor integrated circuit apparatus 1 is accommodated. Therefore, the fixing structure device for the semiconductor integrated circuit apparatus 1 can be widely used.

Also, no cap covering the semiconductor integrated circuit apparatus 1 is used to fix the semiconductor integrated circuit apparatus 1 on the print wiring board 2, an exposed area of the semiconductor integrated circuit apparatus 1 is sufficient to radiate heat from the semiconductor integrated circuit apparatus 1. Therefore, the heat radiation of the semiconductor integrated circuit apparatus 1 can be improved, and the performance of the semiconductor integrated circuit apparatus 1 can be reliably maintained even though a degree of heat generated in the semiconductor integrated circuit apparatus 1 is high.

Embodiment 2

In the first embodiment, the suction portion 6 formed of the single suction disk is arranged in the suction and drawing unit 3. However, in a second embodiment, a plurality of suction portions are arranged in a suction and drawing unit.

Figure 4:
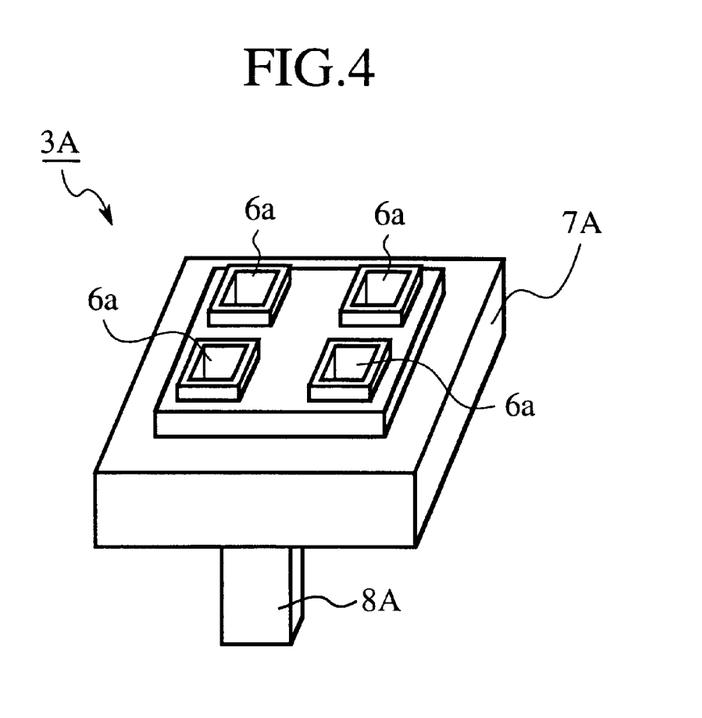
FIG. 4 is an oblique view of a suction and drawing unit composing a fixing structure device for the semiconductor integrated circuit apparatus according to a second embodiment of the present invention.

FIG. 4 is an oblique view of a suction and drawing unit composing a fixing structure device for the semiconductor integrated circuit apparatus according to a second embodiment of the present invention. In FIG. 4, 3A indicates a suction and drawing unit, 6a indicates each of a plurality of suction portions. Each suction portion 6a is formed in a rectangular shape, and the suction portions are arranged in the suction and drawing unit 3A so as to uniformly suction the semiconductor integrated circuit apparatus 1. 7A indicates a fixing portion of the suction and drawing unit 3A. The fixing portion 7A is formed in a rectangular shape. 8A indicates a pressure reducing pipe portion of the suction and drawing unit 3A. The pressure reducing pipe portion 8A is formed in a rectangular shape.

Next, an operation of the suction and drawing unit 3A is described.

Each of the suction portions 6a of the suction and drawing suctions the lower surface of the semiconductor integrated circuit apparatus 1 through the through hole 2a of the print wiring board 2 by reducing the pressure of atmospheric gas existing into the suction and drawing unit 3A, and the semiconductor integrated circuit apparatus 1 is drawn toward the print wiring board 2 by suction. Also, the fixing portion 7A is operated in the same manner as that of the fixing portion 7, and the pressure reducing pipe portion 8A is operated in the same manner as that of the pressure reducing pipe portion 8. Therefore, the suction and drawing unit 3A is operated in the same manner as that of the suction and drawing unit 3.

In particular, even though the size of the semiconductor integrated circuit apparatus 1 is sufficiently large as compared with a total area of the suction portions 6a, because the suction portions 6a are arranged in the suction and drawing unit 3A to uniformly suction the semiconductor integrated circuit apparatus 1, the semiconductor integrated circuit apparatus 1 is drawn toward the print wiring board 2 by the suction portions 6a of the suction and drawing unit 3A without inclining the semiconductor integrated circuit apparatus 1 with respect to the print wiring board 2. Therefore, as compared with the first embodiment, the semiconductor integrated circuit apparatus 1 can be stably fixed on the print wiring board 2 while precisely positioning the lead terminals 4 of the semiconductor integrated circuit apparatus 1 on the pads of the print wiring board 2.

In this embodiment, an atmospheric gas line extends from each suction portion 6a. In this case, it is applicable that a plurality of atmospheric gas lines corresponding to the suction portions 6a respectively pass through the fixing portion 7A and the pressure reducing pipe portion 8A. Also, it is applicable that a plurality of atmospheric gas lines corresponding to the suction portions 6a be connected with an inner gas line existing in the pressure reducing pipe portion 8A.

Accordingly, in the second embodiment, because the plurality of suction portions 6a, which uniformly suction the semiconductor integrated circuit apparatus 1 through the through hole 2a of the print wiring board 2 in the suction operation, are arranged in the suction and drawing unit 3A, even though the size of the semiconductor integrated circuit apparatus 1 is sufficiently large as compared with a total area of the suction portions 6a, the semiconductor integrated circuit apparatus 1 is drawn toward the print wiring board 2 by the suction and drawing unit 3A without inclining the semiconductor integrated circuit apparatus 1 with respect to the print wiring board 2, and the semiconductor integrated circuit apparatus 1 can be stably fixed on the print wiring board 2 while precisely positioning the lead terminals 4 of the semiconductor integrated circuit apparatus 1 on the pads 5 of the print wiring board 2.

Embodiment 3

In a third embodiment, a positioning means is added to the fixing structure device to prevent the semiconductor integrated circuit apparatus 1 from getting out of position or being inclined with respect to the print wiring board 2 in the suction operation.

Figure 5A:
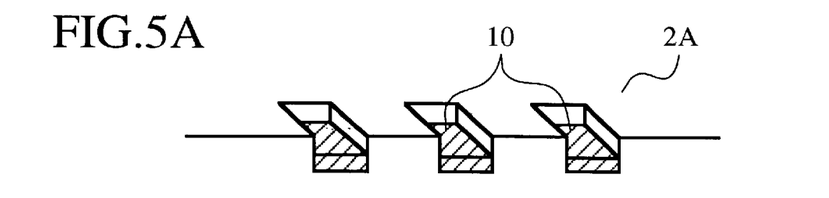
FIG. 5A is a cross sectional view of a plurality of pads arranged in concave areas of a print wiring board as a first example of a fixing structure device for the semiconductor integrated circuit apparatus according to a third embodiment of the present invention.

FIG. 5A is a cross sectional view of a plurality of pads (or wiring portions) arranged in concave areas of a print wiring board as a first example of a fixing structure device for the semiconductor integrated circuit apparatus 1 according to a third embodiment of the present invention. In FIG. 5A, 2A indicates a print wiring board having a plurality of concave areas (functioning as a positioning means of a fixing structure device). 10 indicates each of a plurality of pads (or wiring portions) arranged in the concave areas of the print wiring board 2A.

As shown in FIG. 5A, when the semiconductor integrated circuit apparatus 1 (see FIG. 1) is arranged on the print wiring board 2A, the lead terminals 4 (see FIG. 1) of the semiconductor integrated circuit apparatus 1 are put on the concave areas of the print wiring board 2A. Therefore, the lead terminals 4 of the semiconductor integrated circuit apparatus 1 can be easily and reliably put on the pads 10 of the print wiring board 2A. Thereafter, the suction and drawing unit 3 (shown in FIG. 1) presses the lead terminals 4 of the semiconductor integrated circuit apparatus 1 on the pads 10 of the print wiring board 2A in the suction operation. In this case, because the lead terminals 4 are positioned on the pads 10 placed in the concave areas, there is no probability that the lead terminals 4 of the semiconductor integrated circuit apparatus 1 get out of position in the suction operation. Also, there is no probability that the semiconductor integrated circuit apparatus 1 is inclined with respect to the print wiring board 2A in the suction operation.

Figure 5B:
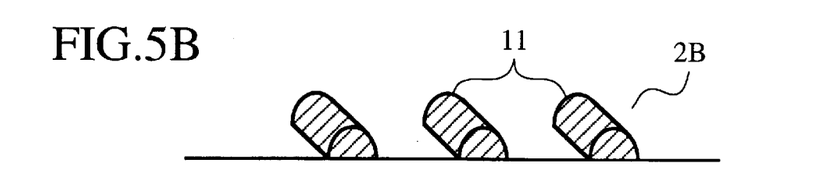
FIG. 5B is a cross sectional view of a plurality of pads arranged in convex areas of a print wiring board as a second example of the fixing structure device for the semiconductor integrated circuit apparatus according to the third embodiment of the present invention.

FIG. 5B is a cross sectional view of a plurality of pads (or wiring portions) arranged in convex areas of a print wiring board as a second example of the fixing structure device for the semiconductor integrated circuit apparatus 1 according to the third embodiment-of the present invention. In FIG. 5B, 2B indicates a print wiring board having a plurality of convex areas (functioning as a positioning means of a fixing structure device). 11 indicates each of a plurality of pads (or wiring portions) arranged in the convex areas of the print wiring board 2B.

As shown in FIG. 5B, because the pads 11 of the print wiring board 2B are placed on the convex areas of the print wiring board 2B, an operator can easily ascertain the positions of the pads 11 in his three-dimensional observation with his own eyes. Therefore, when the semiconductor integrated circuit apparatus 1 is arranged on the print wiring board 2B, the lead terminals 4 of the semiconductor integrated circuit apparatus 1 can be reliably put on the convex areas of the print wiring board 2B. Thereafter, the suction and drawing unit 3 presses the lead terminals 4 of the semiconductor integrated circuit apparatus 1 on the pads 11 of the print wiring board 2B in the suction operation. In this case, because the pads 11 are placed on the convex areas, the convex areas can be deformed in the suction operation to reduce the size of each convex area. Therefore, the suction and drawing unit 3 can strongly press the lead terminals 4 on the pads 11 in the suction operation as compared with in the first embodiment. As a result, a degree of pressure of the semiconductor integrated circuit apparatus 1, which is applied on the print wiring board 2B, can be heightened. Therefore, the electrical connection between the semiconductor integrated circuit apparatus 1 and the print wiring board 2B can be reliably obtained.

Figure 5C:
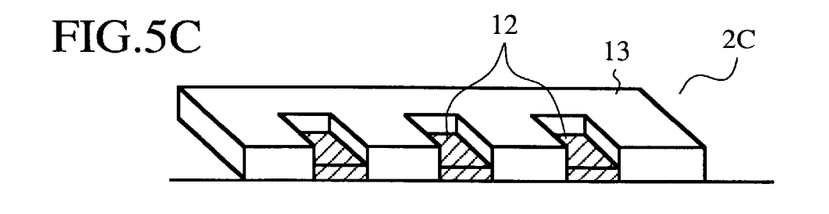
FIG. 5C is a cross sectional view of a plurality of pads arranged in concave areas of a guide layer, which is arranged on a print wiring board, as a third example of the fixing structure device for the semiconductor integrated circuit apparatus according to the third embodiment of the present invention.

FIG. 5C is a cross sectional view of a plurality of pads (or wiring portions) arranged in concave areas of a guide layer, which is arranged on a print wiring board, as a third example of the fixing structure device for the semiconductor integrated circuit apparatus 1 (see FIG. 1) according to the third embodiment of the present invention. In FIG. 5C, 2C indicates a print wiring board. 13 indicates a guide layer having a plurality of concave areas (functioning as a positioning means of a fixing structure device). The guide layer 13 is arranged on the print wiring board 2C. 12 indicates each of a plurality of pads (or wiring portions) arranged in the convex areas of the guide layer 13. The pads 12 are placed on the upper surface of the print wiring board 2C.

As shown in FIG. 5C, when the semiconductor integrated circuit apparatus 1 (see FIG. 1) is arranged on the print wiring board 2C, the lead terminals 4 (see FIG. 1) of the semiconductor integrated circuit apparatus I are put on the concave areas of the guide layer 13. Therefore, the lead terminals 4 of the semiconductor integrated circuit apparatus 1 can be reliably put on the pads 12 of the print wiring board 2C. Thereafter, the suction and drawing unit 3 (see FIG. 1) presses the lead, terminals 4 of the semiconductor integrated circuit apparatus 1 on the pads 12 of the print wiring board 2C in the suction operation. In this case, because the lead terminals 4 are positioned on the pads 12 placed in the concave areas of the guide layer 13, there is no probability that the lead terminals 4 of the semiconductor integrated circuit apparatus 1 gets out of position in the suction operation. Also, there is no probability that the semiconductor integrated circuit apparatus 1 is inclined with respect to the print wiring board 2A in the suction operation.

The depth of each concave area and the height of each convex area are determined on condition that each lead terminal 4 does not get out of position in the suction operation. For example, each concave area has a depth of 0.5 mm or less, and each convex area has a height of 0.5 mm or less. Also, the concave areas and the convex areas shown in FIG. 5A, FIG. 5B and FIG. 5C are formed by thickening a wiring pattern of the print wiring board according to a thin film forming method generally used (for example, a solder resist method or a plating method).

Accordingly, in the first example of the third embodiment, the print wiring board 2A has the concave areas, and the pads 10 are arranged on the concave areas. Therefore, the lead terminals 4 of the semiconductor integrated circuit apparatus 1 can be easily put on the pads 10 of the print wiring board 2A, and the suction and drawing unit 3 can reliably press the lead terminals 4 on the pads 10 without the lead terminals 4 being out of position.

Also, in the second example of the third embodiment, the print wiring board 2B has the convex areas, and the pads 11 are arranged on the convex areas. Therefore, because an operator can easily ascertain the positions of the pads 11 in his three-dimensional observation, the lead terminals 4 of the semiconductor integrated circuit apparatus 1 can be easily put on the pads 11 of the print wiring board 2B. Also, because a degree of pressure of the lead terminals 4, which is applied on the pads 11, is heightened, the degree of the electrical connection between the lead terminals 4 and the pads 11 can be reliably obtained.

Also, in the third example of the third embodiment, because the guide layer 13 is put on the print wiring board 2C to arrange the pads 12 of the print wiring board 2C in the concave areas of the guide layer 13, the lead terminals 4 of the semiconductor integrated circuit apparatus 1 can be easily put on the pads 12 of the print wiring board 2C. Also, because the concave areas of the guide layer 13 prevent the lead terminals 4 from getting out of position, the suction and drawing unit 3 can reliably press the lead terminals 4 on the pads 12 without the lead terminals 4 being out of position.

Next, another positioning means is described.

Figure 6:
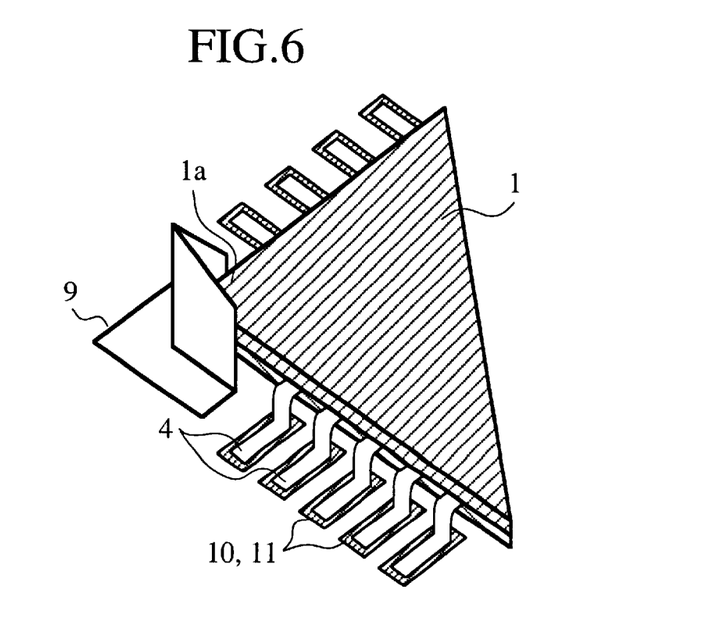
FIG. 6 is an oblique view of a positioning guide composing a fixing structure device for the semiconductor integrated circuit apparatus according to a modification of the third embodiment of the present invention.

FIG. 6 is an oblique view of a positioning guide composing a fixing structure device for the semiconductor integrated circuit apparatus 1 according to a modification of the third embodiment of the present invention. In FIG. 6, 1a indicates one corner portion of the semiconductor integrated circuit apparatus 1 having a rectangular shape. 9 indicates a positioning guide for positioning the corner portion 1a of the semiconductor integrated circuit apparatus 1. The same constituent elements as those shown in FIG. 1 or FIG. 5 are indicated by the same reference numerals as those attached to the constituent elements shown in FIG. 1 or FIG. 5, and the description of the constituent elements is omitted.

In cases where a package of the semiconductor integrated circuit apparatus 1 is determined to a fixed size, a pair of positioning guides 9 are arranged in advance in two positions corresponding to two corners opposite to each other through one diagonal line of the semiconductor integrated circuit apparatus 1 so as to position the semiconductor integrated circuit apparatus 1 on the print wiring board 2A (or 2B) while putting the lead terminals 4 of the semiconductor integrated circuit apparatus 1 on the pads 10 (or 11) of the print wiring board 2A (or 2B). Also, it is applicable that four positioning guides 9 be arranged in four positions corresponding to four corners of the semiconductor integrated circuit apparatus 1 so as to position the semiconductor integrated circuit apparatus 1 on the print wiring board 2A (or 2B) in the same manner.

Thereafter, when the semiconductor integrated circuit apparatus 1 is positioned by using the positioning guides 9 to be put on the print wiring board 2A (or 2B), the lead terminals 4 of the semiconductor integrated circuit apparatus 1 are reliably put on the pads 10 (or 11) of the print wiring board 2A (or 2B). Therefore, the positioning operation of the semiconductor integrated circuit apparatus 1 can be simplified, so that the semiconductor integrated circuit apparatus 1 can be easily fixed on the print wiring board 2A (or 2B).

Accordingly, in the modification of the third embodiment, because the positioning guides 9 are arranged in advance on the print wiring board 2A (or 2B) so as to put the lead terminals 4 of the semiconductor integrated circuit apparatus 1 on the pads 10 (or 11) of the print wiring board 2A (or 2B), the positioning operation of the semiconductor integrated circuit apparatus 1 can be simplified, and the semiconductor integrated circuit apparatus 1 can be easily fixed on the print wiring board 2A (or 2B).

What is claimed is:

1. A fixing structure for a semiconductor integrated circuit apparatus, in which a semiconductor integrated circuit apparatus is fixed on a print wiring board, comprising:

a hole portion arranged in the print wiring board; and suction and fixing means, extending through the hole portion, for suctioning the semiconductor integrated circuit apparatus through the hole portion to press an external connecting terminal of the semiconductor integrated circuit apparatus on a wiring portion of the print wiring board and for fixing the semiconductor integrated circuit apparatus on the print wiring board.

2. A fixing structure for a semiconductor integrated circuit apparatus according to claim 1, wherein the suction and fixing means comprises:

a suction portion for suctioning the semiconductor integrated circuit apparatus through the hole portion;

a fixing portion for making contact with the print wiring board during the suction of the suction portion; and a pressure reducing tube portion, connected with an external pressure reducing unit, for setting the suctioning portion to a pressure reduced state.

3. A fixing structure for a semiconductor integrated circuit apparatus according to claim 2, wherein the suction portion, the fixing portion and the pressure reducing tube portion are integrally formed with each other.

4. A fixing structure for a semiconductor integrated circuit apparatus according to claim 2, wherein the fixing portion of the suction and fixing means is pressed into the hole portion of the print wiring board to fix the suction and fixing means to the print wiring board.

5. A fixing structure for a semiconductor integrated circuit apparatus according to claim 2, wherein the fixing portion of the suction and fixing means is soldered to a reverse surface of the print wiring board to fix the suction and fixing means to the print wiring board.

6. A fixing structure for a semiconductor integrated circuit apparatus according to claim 2, wherein the suction and fixing means adjusts a degree of pressure of the external connecting terminal of the semiconductor integrated circuit apparatus, which is applied on the wiring portion of the print wiring board, according to the pressure reduced state of the suction portion.

7. A fixing structure for a semiconductor integrated circuit apparatus according to claim 2, wherein the fixing portion makes contact with a peripheral portion of the hole portion on a reverse side of the print wiring board.

8. A fixing structure for a semiconductor integrated circuit apparatus according to claim 1, wherein the suction and fixing means comprises:

a plurality of suction portions for respectively suctioning the semiconductor integrated circuit apparatus through the hole portion;

a fixing portion for making contact with the print wiring board during the suctioning of the suction portions; and a pressure reducing tube portion, connected with an external pressure reducing unit, for setting each of the suction portions to a pressure reduced state.

9. A fixing structure for a semiconductor integrated circuit apparatus according to claim 1, wherein the suction and fixing means adjusts a degree of pressure of the external connecting terminal of the semiconductor integrated circuit apparatus, which is applied on the wiring portion of the print wiring board, by moving the suction and fixing means in a suction direction.

10. A fixing structure for a semiconductor integrated circuit apparatus according to claim 1, further comprising:

a positioning guide, arranged on the print wiring board, for positioning the semiconductor integrated circuit apparatus.

11. A fixing structure for a semiconductor integrated circuit apparatus according to claim 1, in which the wiring portion is placed in a concave area of the print wiring board, and the external connecting terminal of the semiconductor integrated circuit apparatus is pressed on the wiring portion placed in the concave area of the print wiring board.

12. A fixing structure for a semiconductor integrated circuit apparatus according to claim 1, in which the wiring portion is placed in a convex area of the print wiring board, and the external connecting terminal of the semiconductor integrated circuit apparatus is pressed on the wiring portion placed in the convex area of the print wiring board.

13. A fixing structure for a semiconductor integrated circuit apparatus according to claim 1, further comprising:

a guide layer which has a concave area and is arranged on the print wiring board, wherein the wiring portion of the print wiring board is placed in the concave area of the guide layer.

14. A fixing structure for a semiconductor integrated circuit apparatus according to claim 1, wherein the suction and fixing means is formed of elastic material.

* * * * *